(12) United States Patent
Ross

(10) Patent No.: US 10,868,539 B1
(45) Date of Patent: Dec. 15, 2020

(54) FIELD PROGRAMMABLE GATE ARRAY INCLUDING COUPLED LOOKUP TABLES

(71) Applicant: Google LLC, Mountain View, CA (US)

(72) Inventor: Jonathan Ross, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/784,875

(22) Filed: Feb. 7, 2020

Related U.S. Application Data

(63) Continuation of application No. 16/435,842, filed on Jun. 10, 2019, now Pat. No. 10,560,102, which is a continuation of application No. 15/810,496, filed on Nov. 13, 2017, now Pat. No. 10,320,390.

(60) Provisional application No. 62/423,535, filed on Nov. 17, 2016.

(51) Int. Cl.
*H03K 19/17728* (2020.01)
*H03K 19/1776* (2020.01)
*H03K 19/17736* (2020.01)

(52) U.S. Cl.
CPC ... *H03K 19/17728* (2013.01); *H03K 19/1776* (2013.01); *H03K 19/17744* (2013.01)

(58) Field of Classification Search
None
See application file for complete search history.

(56) References Cited

U.S. PATENT DOCUMENTS

| | | |
|---|---|---|
| 6,557,156 B1 | 4/2003 | Guccione |
| 6,883,109 B2 | 4/2005 | Erickson et al. |
| 7,193,436 B2* | 3/2007 | Wang ............... H03K 19/17728 326/38 |
| 7,420,390 B1 | 9/2008 | Hutton |
| 7,584,345 B2 | 9/2009 | Doering et al. |
| 7,603,540 B2 | 10/2009 | Doering et al. |
| 7,679,401 B1 | 3/2010 | Redgrave |
| 9,055,069 B2 | 6/2015 | Zievers |
| 9,111,068 B2 | 8/2015 | Gloster et al. |
| 9,411,554 B1* | 8/2016 | Young .................... G06F 7/5324 |
| 2003/0055852 A1* | 3/2003 | Wojko ...................... G06F 7/57 708/230 |
| 2012/0330638 A1 | 12/2012 | Pell et al. |
| 2013/0093460 A1 | 4/2013 | Voogel |
| 2013/0093462 A1 | 4/2013 | Teig |
| 2013/0207170 A1 | 8/2013 | Kurokawa |
| 2013/0293263 A1 | 11/2013 | Kurokawa |
| 2014/0103960 A1 | 4/2014 | Yamazaki et al. |
| 2014/0106960 A1 | 4/2014 | Endo |
| 2015/0229310 A1 | 8/2015 | Chang et al. |
| 2016/0322975 A1* | 11/2016 | Ikeda .................. H01L 29/7869 |
| 2017/0085408 A1 | 3/2017 | Yensen et al. |
| 2018/0113812 A1 | 4/2018 | Luo |

FOREIGN PATENT DOCUMENTS

EP 3065300 1/2018

* cited by examiner

*Primary Examiner* — Minh D A
*Assistant Examiner* — James H Cho
(74) *Attorney, Agent, or Firm* — Fish & Richardson P.C.

(57) ABSTRACT

A field programmable gate array (FPGA) includes: a first logic block having a first lookup table; and a second logic block having a second lookup table, wherein the first logic block is coupled to the second logic block, in which the first logic block is configured to pass, upon a clock cycle of the FPGA, data about a lookup table configuration stored in the first lookup table to the second logic block.

8 Claims, 7 Drawing Sheets

| | t0 | t1 | t2 | t3 | t4 | t5 | t6 | t7 | t8 |
|---|---|---|---|---|---|---|---|---|---|
| LUT1 | F1 | F2 | F2 | F2 | F2 | F2 | F2 | F2 | F2 |
| LUT2 | F1 | F1 | F2 | F2 | F2 | F2 | F2 | F2 | F2 |
| LUT3 | F1 | F1 | F1 | F2 | F2 | F2 | F2 | F2 | F2 |
| LUT4 | F1 | F1 | F1 | F1 | F2 | F2 | F2 | F2 | F2 |
| LUT5 | F1 | F1 | F1 | F1 | F1 | F2 | F2 | F2 | F2 |
| LUT6 | F1 | F1 | F1 | F1 | F1 | F1 | F2 | F2 | F2 |
| LUT7 | F1 | F1 | F1 | F1 | F1 | F1 | F1 | F2 | F2 |
| LUT8 | F1 | F1 | F1 | F1 | F1 | F1 | F1 | F1 | F2 |

FIELD PROGRAMMABLE GATE ARRAY INCLUDING COUPLED LOOKUP TABLES

CROSS-REFERENCE TO RELATED APPLICATIONS

This application is a continuation of U.S. application Ser. No. 16/435,842, filed on Jun. 10, 2019, which is a continuation of U.S. Ser. No. 15/810,496, filed on Nov. 13, 2017, which claims priority to and benefit of U.S. Application Ser. No. 62/423,535, filed on Nov. 17, 2016, the entire contents of which are hereby incorporated by reference.

TECHNICAL FIELD

This present disclosure relates to field programmable gate arrays including coupled lookup tables.

BACKGROUND

Field programmable gate arrays (FPGAs) include a matrix of programmable logic blocks and a network of reconfigurable bus lines through which the programmable logic blocks can be inter-wired. The programmable logic blocks can be configured to perform a range of different functions from simple circuit logic, such as AND and OR operations, to more complex combinational functions. FPGAs can be reprogrammed for desired applications or functionality requirements after manufacturing.

SUMMARY

The implementations described herein may have one or more of the following advantages. For example, by coupling logic blocks of an FPGA together so that lookup table configurations may be passed between logic blocks rather than loaded when the FPGA is powered up, it is possible, in some implementations, to substantially decrease the time needed to load lookup tables, and thus change functions performed by the logic blocks, across the coupled logic blocks of the FPGA. In some implementations, the operations performed by the logic blocks of the FPGA may be changed on the order of millions or billions of times per second. In some implementations, the memory cells of the lookup tables employ non-volatile complementary metal oxide semiconductor (CMOS) based memory cells. Given that the power usage of a CMOS based memory cell is proportional, in part, to the leakage current of the memory cell, the power consumption of the FPGA may be reduced. Furthermore, when a lookup table configuration bit passed to a particular memory cell is the same as the bit already existing in that memory cell, the bit can be left unchanged, reducing the power consumption of the copy operation.

The details of one or more implementations are set forth in the accompanying drawings and the description below. Other features and advantages will be apparent from the description, the drawings, and from the claims.

BRIEF DESCRIPTION OF THE DRAWINGS

FIG. 7 is a schematic that illustrates an example of a timing diagram for an FPGA.

DETAILED DESCRIPTION

The present disclosure is directed to field programmable gate arrays (FPGAs) with coupled lookup tables. In general, in certain aspects, an FPGA includes multiple logic blocks, each of which includes a corresponding lookup table. A first logic block in the FPGA is coupled to a second logic block in the FPGA, such that a lookup table configuration stored by the first logic block may be passed directly to the second logic block. In certain implementations, a first lookup table of the first logic block is coupled directly to a second lookup table of the second logic block, allowing the lookup table configuration to be directly transmitted to and loaded by the second lookup table. The lookup table configurations stored in the lookup tables at any given time defines a function/operation to be performed by the logic block on received inputs. By coupling the logic blocks together in the manner described herein, it is possible to substantially decrease the time needed to load lookup tables, and thus change functions performed by the logic blocks, across the FPGA. Accordingly, in certain implementations, the operations performed by the FPGA may be changed on the order of millions or billions of times per second as opposed to hundreds of times per second with existing FPGA designs.

Figure 1:
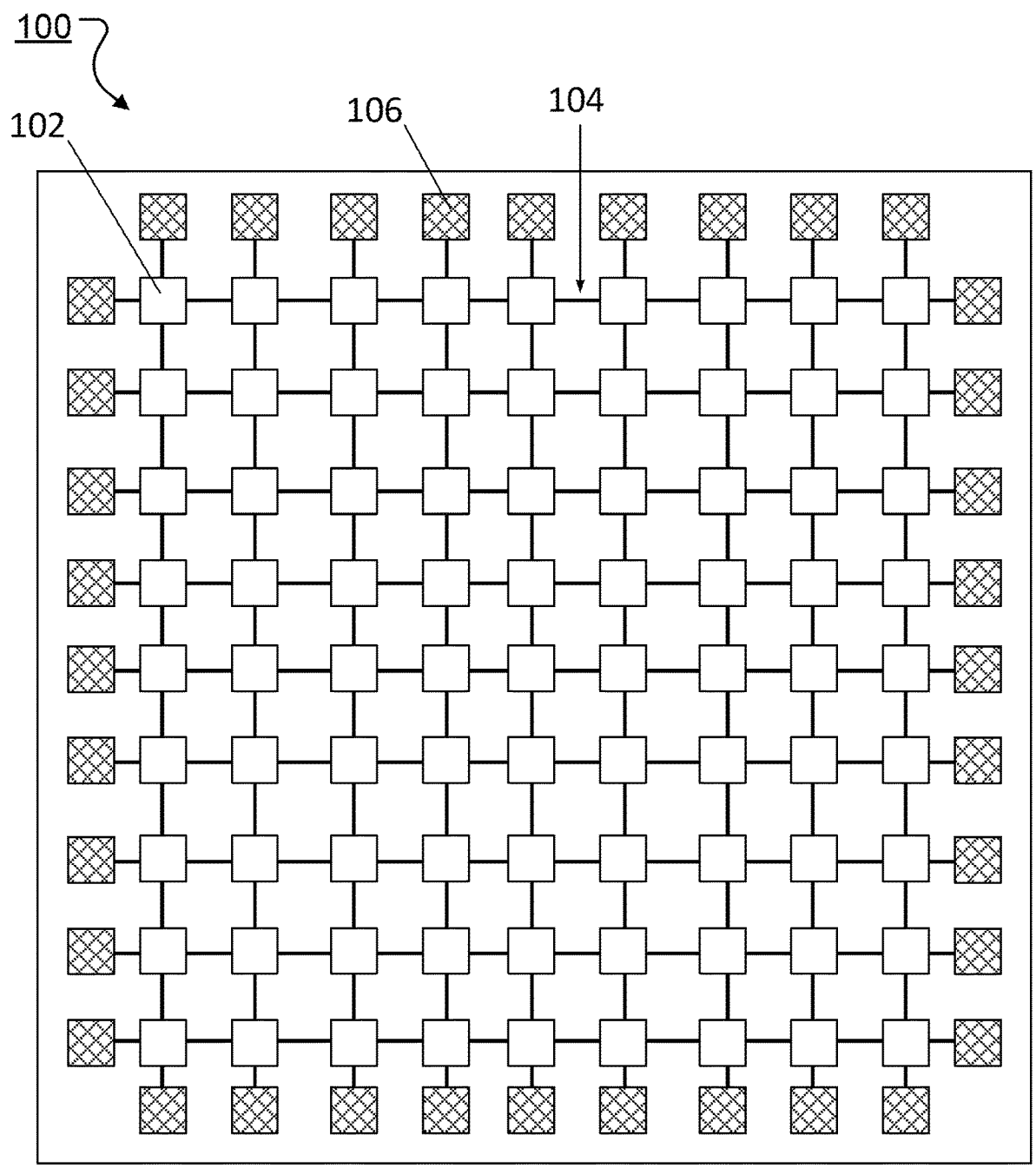
FIG. 1 is a schematic that illustrates an example of an FPGA.

FIG. 1 is a schematic that illustrates an example of an FPGA 100 according to the present disclosure. The FPGA 100 includes an array or matrix of programmable logic blocks (also referred to as programmable logic cells) 102 (solid white squares shown in FIG. 1). The programmable logic blocks 102 may be selectively linked together by a programmable interconnect structure 104 made up of direct connections between neighboring logic blocks 102 and a network of bus lines and connecting switches distributed between the logic blocks 102 in the array 100. The programmable logic blocks 102 may be arranged in a 1D array or 2D array having rows and columns. Around the perimeter of the array, a set of input and output pads 106 (hatched squares shown in FIG. 1) connect to the interconnect structure 104 and/or to the programmable logic blocks 102.

Figure 2:
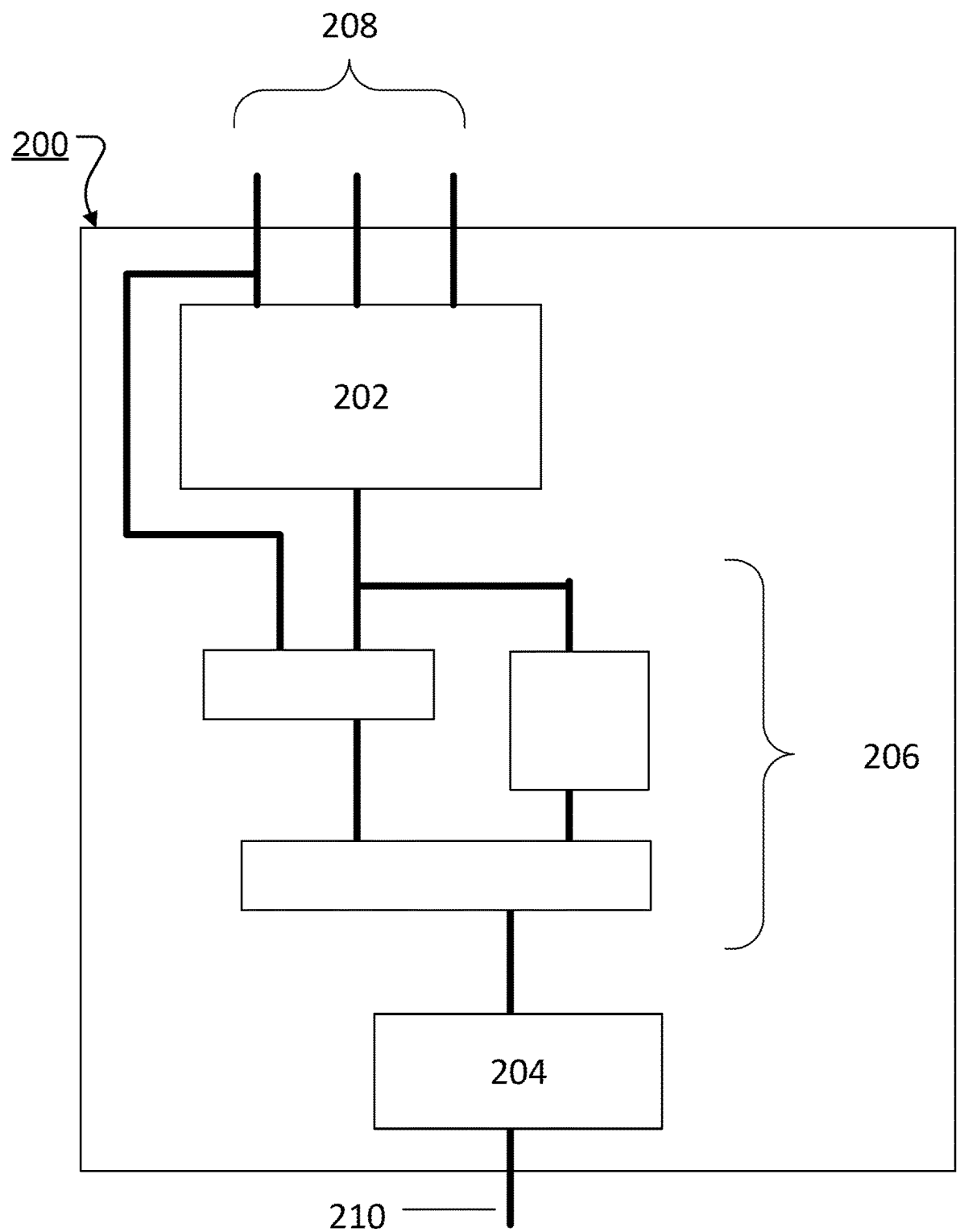
FIG. 2 is a schematic that illustrates an example of an individual programmable logic block.

FIG. 2 is a schematic that illustrates an example of an individual programmable logic block 200 that may be found in an FPGA, such as FPGA 100. The programmable logic block 200 may include various circuit elements that are configured and arranged to carry out logic functions. The programmable logic block 200 shown in FIG. 2 is a simplified example of a logic block that includes one or more lookup tables 202, one or more flip-flops 204, as well as other combinatorial logic circuit elements (e.g., ANDs, ORs, NANDs, XORs, etc.) 206. The programmable logic block 200 may also include inputs 208 for receiving data (e.g., output data from other programmable logic blocks) and clock signals. The programmable logic block 200 may also include one or more outputs 210 for outputting the results of the logic functions carried out by the block 200, among other data.

The lookup table 202 of programmable logic block 200 may include multiple memory cells that store a set of data bits whose value correspond to a truth table for a particular function. A set of input signals presented on the lookup table's memory address lines causes the lookup table 202 to provide an output on the lookup table's data output line that corresponds to the value stored at the address designated by the set of input signals. For example, the lookup table 202 may include 16 memory cells, each capable of storing a bit, and that are addressable by 4 input lines. Other lookup table sizes are possible as well including, for example, 32 memory cells addressable by 5 input lines, 64 memory cells addressable by 6 memory lines, 128 memory cells addressable by 7 memory lines, 256 memory cells addressable by 8 memory lines, 512 memory cells addressable by 9 memory lines, among others. In some implementations, multiple lookup tables may be used in combination to function as a single lookup table. Thus, depending on the configuration of the memory cells of the lookup table 202, the lookup table 202 may implement a function determined by the stored values in memory.

A technique to configure a lookup table of an FPGA includes loading the lookup table configuration (e.g., the bit values to be stored by the different memory cells of the lookup table) from a separate memory component (e.g., read-only memory (ROM)) when powering up the FPGA. For example, the lookup table configuration may be shifted into the FPGA one bit at a time each cycle of the clock signal. During operation of the FPGA and once the lookup table configuration has been loaded, the configuration employed be each lookup table of the FPGA is not changed. Accordingly, modifying the lookup table may require cycling power to the FPGA every time a change to the table configuration is desired, limiting the frequency with which the configuration may be changed to, e.g., hundreds of times per second.

Figure 3:
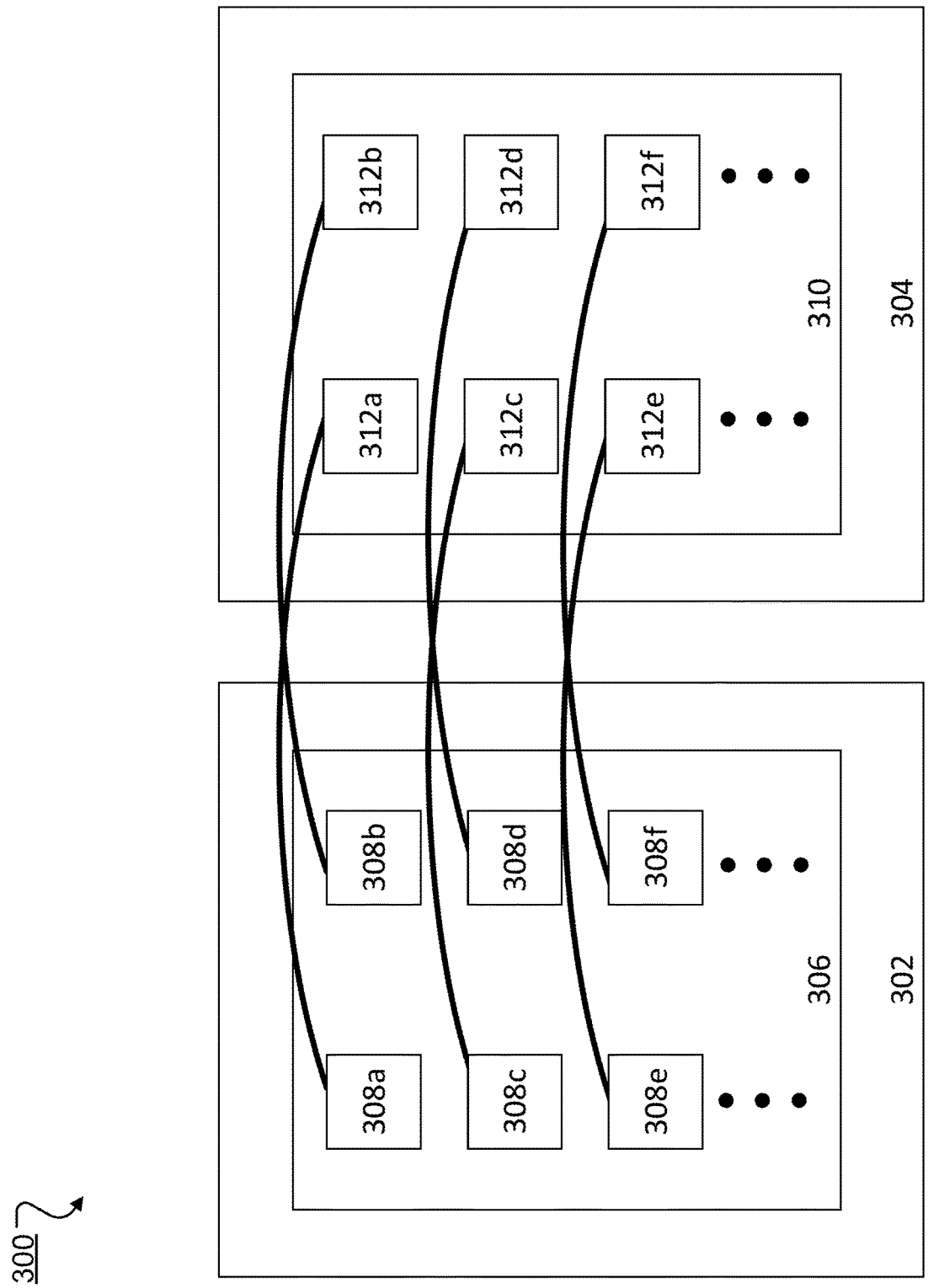
FIG. 3 is a schematic that illustrates an example of a portion of a reconfigurable FPGA.

FIG. 3 is a schematic that illustrates an example of a portion 300 of a reconfigurable FPGA according to the present disclosure that allows a substantial increase in the frequency with which the lookup table configurations may be updated. For ease of viewing, only two programmable logic blocks (first programmable logic block 302 and second programmable logic block 304) of the FPGA 300 are shown in FIG. 3, though the FPGA 300 may contain more programmable logic blocks that are arranged together, e.g., in a matrix configuration of rows and columns. In the present example, the first programmable logic block 302 is directly adjacent to the second programmable logic block 304. For instance, the first programmable logic block 302 may be located in the same row of the FPGA 300 as the second programmable logic block 304, but in a column that is directly adjacent to the column in which the second programmable logic block 304 is located. Similarly, the first programmable logic block 302 may be located in the same column of the FPGA 300 as the second programmable logic block, but in a row that is directly adjacent to the row in which the second programmable logic block 304 is located.

The first and second programmable logic blocks 302, 304 may include various circuit elements that are configured and arranged to carry out logic functions similar to the programmable logic block 200. In contrast to logic block 200, however, the first and second logic blocks 302, 304 are configured such that the lookup table configuration stored by the first logic block 302 may be passed directly to and used by the second logic block 304.

For instance, the first logic block 302 includes a first lookup table 306 having multiple first memory cells 308. Similarly, the second logic block 304 includes a second lookup table 310 having multiple second memory cells 312.

The number of memory cells within the first lookup table 306 may be the same as the number of memory cells within the second lookup table 310.

To enable a transfer of the lookup table configuration from the first logic block 302 to the second logic block 304, the first memory cells 308 are coupled to the second memory cells 312. In some implementations, each first memory cell 308 of the first lookup table 306 corresponds to a respective second memory cell 312 of the second lookup table 310 and is coupled to the corresponding second memory cell 312 of the second lookup table 310. For example, first memory cell 308a is coupled to second memory cell 312a, first memory cell 308b is coupled to second memory cell 312b, first memory cell 308c is coupled to second memory cell 312c, fourth memory cell 312d is coupled to fourth memory cell 312d and so forth. The configuration shown in FIG. 3 may be repeated throughout the programmable logic blocks of the FPGA. For example, each individual second memory cell 312 of the second lookup table may be coupled to a respective third memory cell of a third lookup table located in a third programmable logic block that is directly adjacent to the second programmable logic block. Similarly, each individual third memory cell of the third lookup table may be coupled to a respective fourth memory cell of a fourth lookup table located in a fourth programmable logic block located directly adjacent to the third programmable logic block, and so on.

In some implementations, the memory cells 308, 312 may be tied to a common global clock signal such that upon the occurrence of a clock-cycle (e.g., upon receiving a rising or falling edge of a clock-cycle) at the clock input terminal of the first memory cell 308, the data stored by the memory cell is passed from the first memory cell 308 to a corresponding second memory cell 312. With each memory cell within a lookup table coupled to a corresponding respective memory cell within a lookup table of an adjacent programmable logic block, it is possible to pass the entire lookup table configuration from one lookup table to another lookup table.

Coupling memory cells together may include, for example, wiring the memory cells to one another. For example, in some implementations, each memory cell of a lookup table has a data input terminal to which a configuration bit may be written as well as a data output terminal from which the configuration bit stored by the lookup table may be read. Thus, coupling a first memory cell 308 of the first lookup table 306 to a second memory cell 312 of the second lookup table 310 may include wiring the data output terminal of the first memory cell 308 to the data input terminal of the second memory cell 312 to allow the data stored by the first memory cell 308 to be copied to the second memory cell 312.

The first and second memory cells 308, 312 may include complementary metal oxide semiconductor (CMOS)-based memory cells. An advantage of using CMOS-based memory is that CMOS requires relatively little current, and thus power, to operate and can efficiently store configuration data for relatively long periods of time, powered only from either low-voltage power sources, such as dry cells or lithium batteries. An example of a CMOS-based memory cell includes a D-type flip-flop register. The D flip-flop captures the value of data present at the input terminal at a definite portion of a clock cycle (such as the rising or falling edge of the clock). That captured value then is stored by the register and appears on the output terminal. An advantage of a D-type flip-flop register is that, in some implementations, the clock signal serves as the enable, and no additional enable signal is necessary, thus potentially reducing the power consumed by a copy operation. Furthermore, for CMOS-based memory cells, when a lookup table configuration bit passed to a particular memory cell is the same as the bit already existing in that memory cell, the bit can be left unchanged, further reducing the power consumption of the copy operation.

Figure 4:
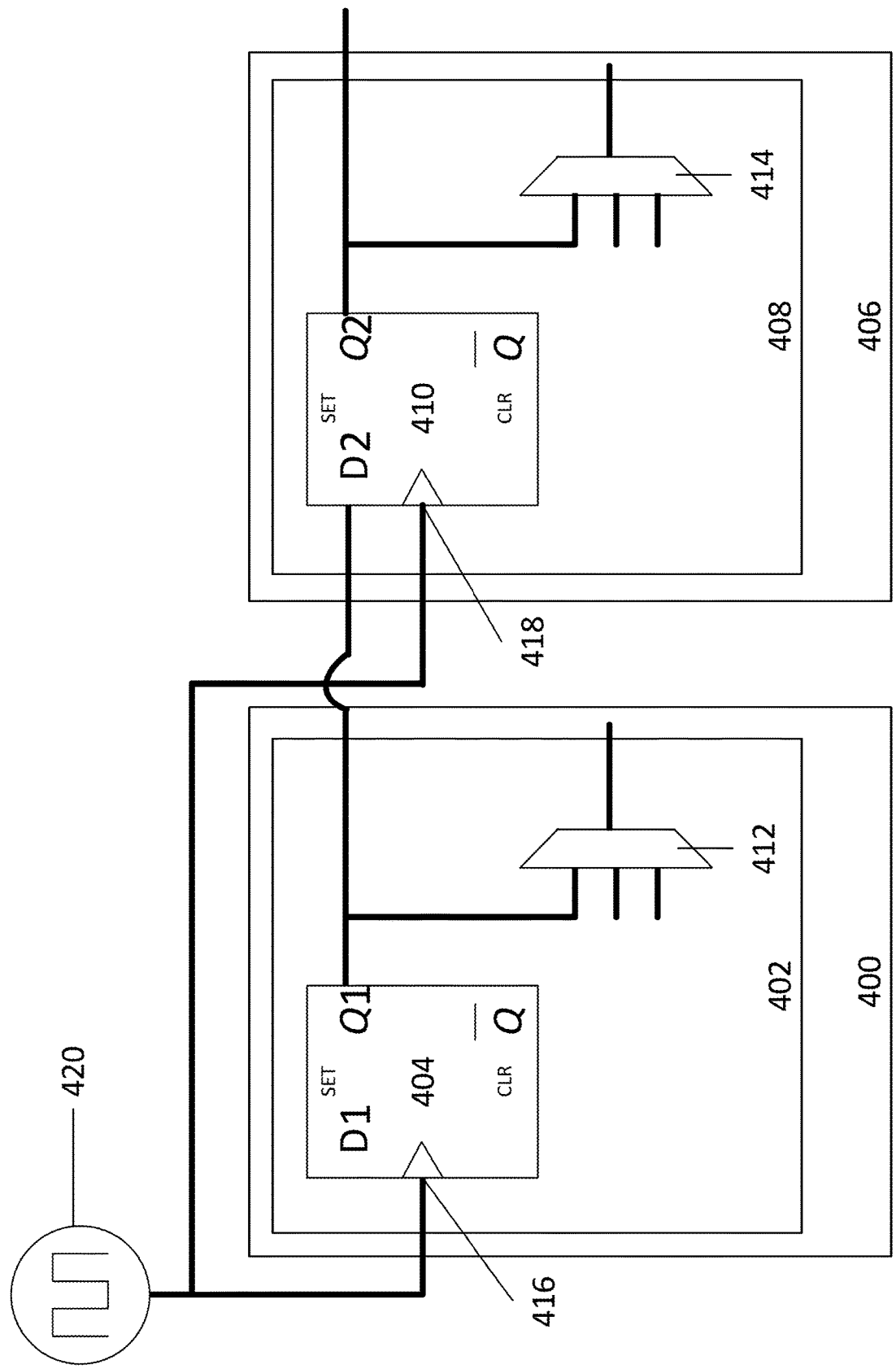
FIG. 4 is a schematic that illustrates an example of a first flip-flop from a first lookup table in a first programmable logic block directly coupled to a second flip-flop from a second lookup table in a second programmable logic block.

FIG. 4 is a schematic that illustrates an example of a first flip-flop 404 from a first lookup table 402 in a first programmable logic block 400 directly coupled to a second flip-flop 410 from a second lookup table 408 in a second programmable logic block 406. The first and second flip-flops 404, 410 serve as memory cells within their respective lookup tables. As shown in FIG. 4, a data output $Q_1$ of the first flip-flop 404 is coupled directly to the data input $D_2$ of the second flip-flop 410. The outputs of each flip-flop are also tied to corresponding select logic (e.g., MUXes) 412, 414 for providing an output from the lookup table when the appropriate address signal is received. The first flip-flop 404 and the second flip-flop 410 have a clock input terminal 416 and clock input terminal 418, respectively, that are tied to a global clock signal 420 for the FPGA. Upon the occurrence of a clock-cycle (e.g., upon receiving a rising or falling edge of a clock-cycle), the data stored by the first flip-flop 404 is passed from output terminal $Q_1$ to input terminal $D_1$.

Other types of flip-flops and CMOS-based memory cells may be used instead. For example, in some implementations, the memory cells may include SRAM. Like D flip-flops, SRAM cells do not need to be refreshed. However, SRAM may require the use of a separate enable terminal in addition to the clock input terminal so that data can be read from and written to the SRMA.

As explained herein, upon the occurrence of a clock-cycle at the clock input terminal of a memory cell (e.g., upon receiving a rising or falling edge of a clock-cycle), the data stored by a memory cell within a lookup table of a programmable logic block is passed from a data output terminal of the memory cell to a data input terminal of a corresponding memory cell in a lookup table located in adjacent programmable logic block. This coupling arrangement may be implemented for each programmable logic block of the FPGA. Thus, for FPGA designs that are highly replicated (e.g., where the desired functionality of a large number of programmable logic blocks within the FPGA is the same), an advantage of the presently disclosed technique is that, in some implementations, the lookup table configuration may be updated across the programmable logic blocks with high efficiency. That is, for such implementations, there is no longer a need to cycle the power of the FPGA to load new lookup table configurations. Rather, the lookup table configurations of the programmable logic blocks are updated with a clock signal of the FPGA. Nor is there a need, in such implementations, to directly load lookup table configurations to each individual programmable logic blocks. Rather, the lookup table configurations may be efficiently copied from neighboring programmable logic blocks.

Figure 5:
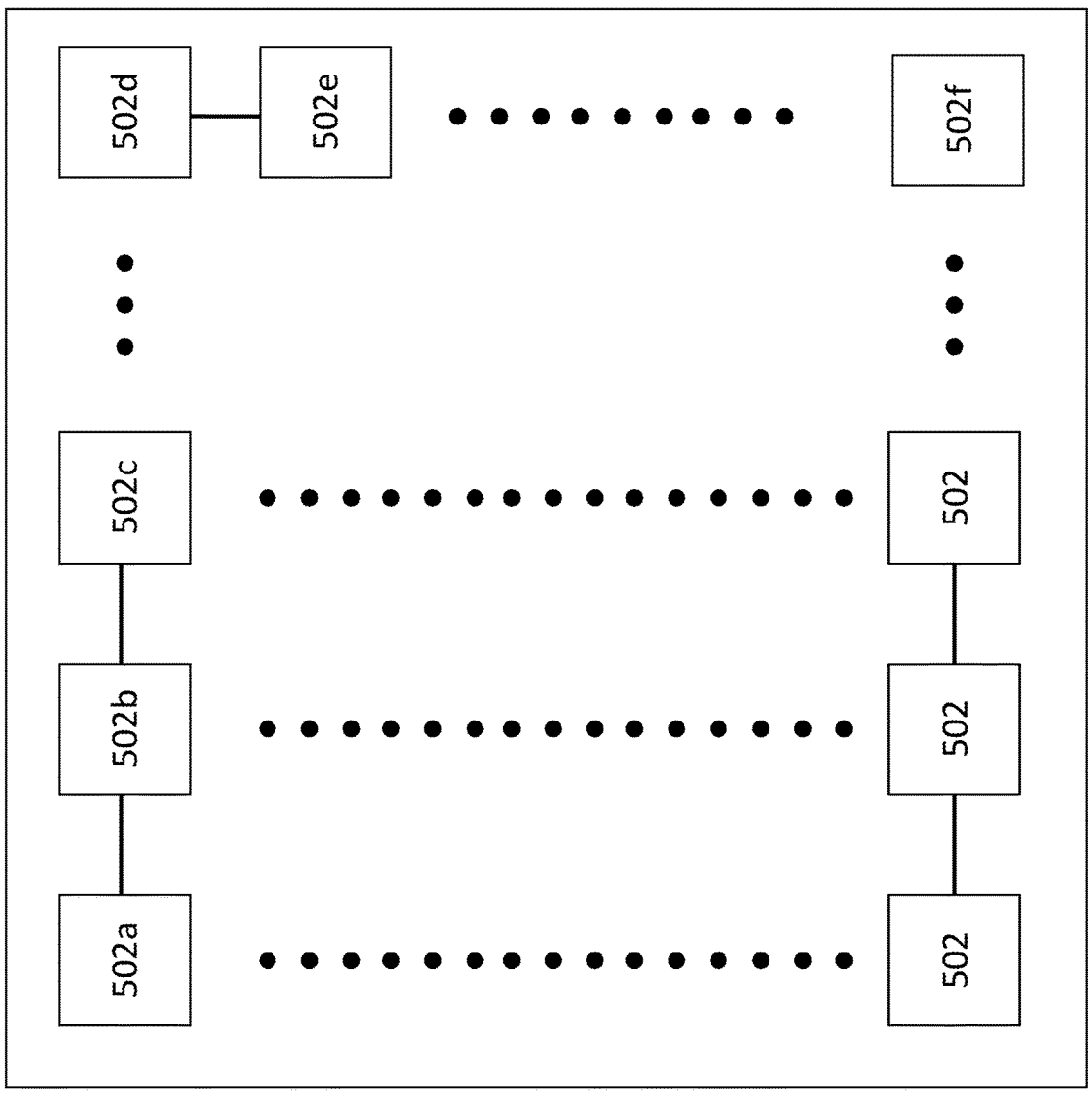
FIG. 5 is a schematic illustrating an example of an FPGA.

A schematic illustrating an example of an FPGA 500 relying on highly replicated lookup table functionality is shown in FIG. 5. In particular, FPGA 500 includes an array of N programmable logic blocks 502, in which N can be an integer number greater than 1, such as, e.g., 16, 25, 36, 42, 64, 100, 400, 900, among others. If it is desired that the lookup tables of each programmable logic block 502 utilize the same lookup table configuration, then each one of N-1 of the programmable logic blocks is coupled to an adjacent programmable logic block in the array, such that the lookup table configuration can be passed between the coupled blocks. For example, assuming an M×M array of programmable logic blocks, then the lookup table of the first logic block 502a in the first row of the array may be coupled to the lookup table of the second logic block 502b in the first row of the array. The lookup table of the second logic block 502b in the first row, in turn, may be coupled to the lookup table of the third logic block 502c in the first row of the array. The lookup table of the last logic block 502d in the first row of the array may be coupled to the lookup table of the last logic block 502e in the second row of the array. Only the lookup table of the Nth logic block 502f in the last row of the array may not be configured to pass a lookup table configuration on to another logic block.

Other configurations of coupling between logic blocks, and more particularly of coupling between lookup tables of different logic blocks, are also possible. For example, instead of coupling logic blocks in a winding pattern, as described with respect to FIG. 5, the lookup table configuration may only be passed along rows, or only passed along columns of the FPGA. In some implementations, the connections coupling different logic blocks, and more particularly coupling the lookup tables of different logic blocks, may be reconfigurable. For example, in some implementations, the connections may include programmable switches so that any desired coupling arrangement may be obtained.

One or more memory components may still be required to provide the lookup table configuration to at least one of the programmable logic blocks. The memory component may include, e.g., read-only memory (ROM), flash memory, another FPGA, or even a microprocessor or microcontroller, among other types of memory components. The memory component that stores and/or provides the lookup table configurations may be located on the FPGA or located on a separate chip from the FPGA and electronically coupled to the FPGA. The lookup table configuration from the memory component may be loaded into a first programmable logic block in a similar manner that the lookup table configurations are passed between adjacent programmable logic blocks.

Figure 6:
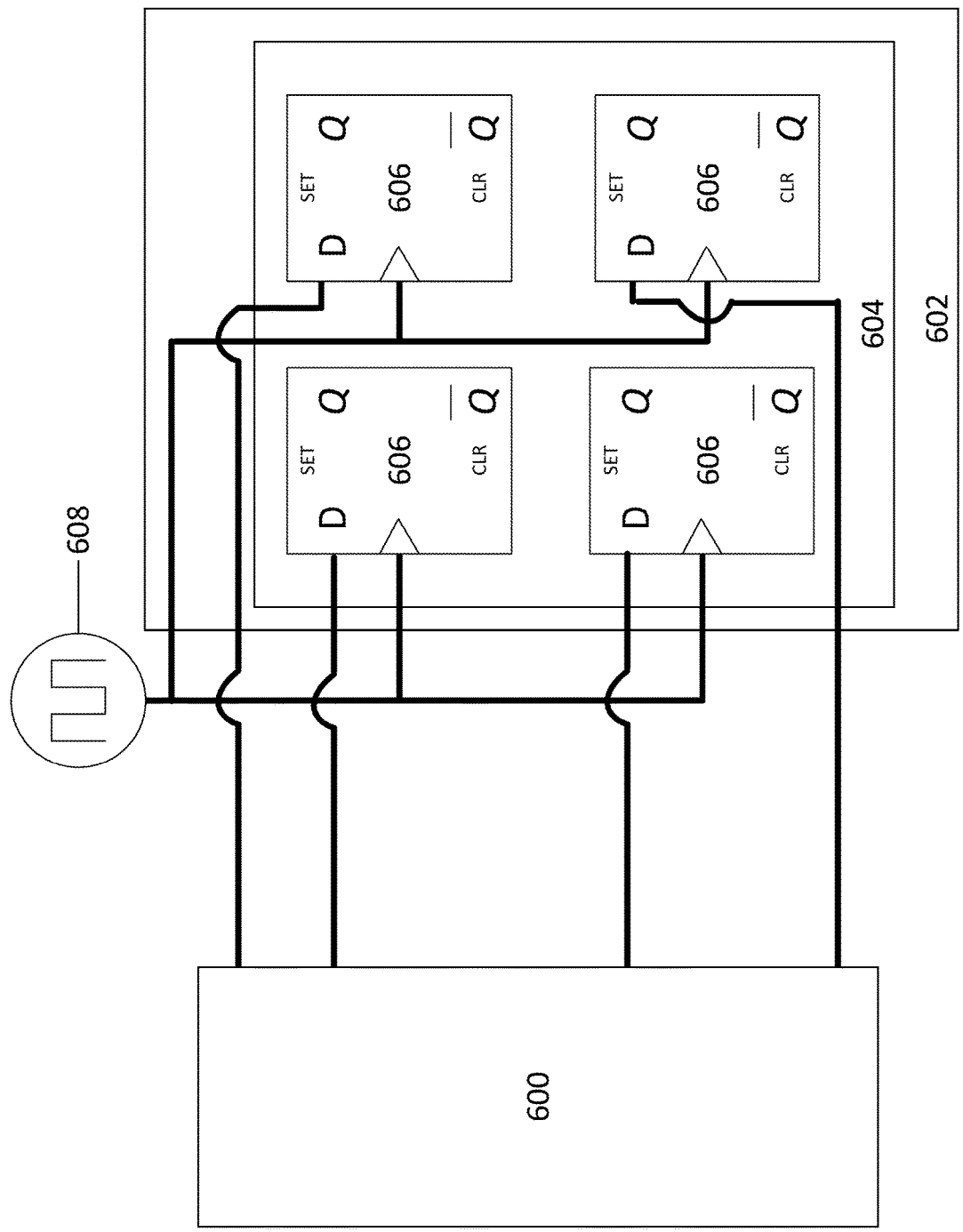
FIG. 6 is a schematic that illustrates an example of a memory component coupled to a programmable logic block.

FIG. 6 is a schematic that illustrates an example of a memory component 600 coupled to a programmable logic block 602. In particular, data output terminals of the memory component 600 may be coupled to the multiple memory cells 606 of a lookup table 604 within the logic block 602. The memory component 600 may store one or more lookup table configurations. In response to a control signal (e.g., from a microprocessor coupled to the memory component 600), a particular one of the stored lookup table configurations may be selected and provided on the output terminals of the memory component. Each memory cell 606, upon receiving a clock signal (e.g., a rising or falling edge of a clock signal) 608, then may load a corresponding bit of the lookup table configuration. In implementations in which the memory cells 606 are also coupled to the memory cells of another lookup table in a different programmable logic block, then the configuration stored in table 604 will be passed to the other lookup table upon occurrence of the next clock cycle. During operation of the FPGA, the memory component 600 may switch to a different lookup table configuration. For example, the memory component 600 may receive another control signal and, in response to receiving the new control signal, provide the newly selected lookup table configuration on the output terminals of the memory component 600. Upon occurrence of the next clock cycle of the global clock signal, the new lookup table configuration may be loaded into the memory cells 606 of the lookup table 604.

In some implementations, multiple different memory components may be used to load the lookup table configurations. For example, in some cases, a first memory component may be coupled to a first programmable logic block of a first row or first column of the FPGA, a second memory component may be coupled to a another programmable logic block located in a second row or second column of the FPGA, a third memory component may be coupled to yet another programmable logic block located in a third row or third column of the FPGA, and so forth.

FIG. 7 is a schematic that illustrates an example of a timing diagram 700 for an FPGA according to the present disclosure. The FPGA represented by the timing diagram 700 includes eight different programmable logic blocks, each of which has a corresponding lookup table. The lookup tables 704 are represented on the left side of the timing diagram 700 as LUT1 . . . LUT8. The first lookup table LUT1 is understood to be adjacent to LUT2 in the FPGA. Similarly, LUT2 is understood to be adjacent to LUT3 in the FPGA and so forth. For the purposes of this example, it is understood that each lookup table is coupled to an adjacent lookup table in the manner described herein, such that a lookup table configuration may be passed between different lookup tables upon receiving a clock signal. The top side of the diagram 700 illustrates the clock signal 702 of the FPGA. The parameter F1 represents a first lookup table configuration corresponding to a first function and the parameter F2 represents a second lookup table configuration corresponding to a second function. It is assumed that at t0, each lookup table stores the same lookup table configuration F1. At the rising edge of the first clock cycle t1, the new lookup table configuration F2 is loaded into the first lookup table LUT1. For example, the new lookup table configuration F2 may be loaded from a memory component coupled to the FPGA. At the same time, the prior lookup table configuration F1 stored in LUT1 is copied to LUT2. However, since the configuration F1 is the same as the configuration already existing in LUT2, the configuration does not appear to change. Similarly, the configuration in LUT2 is copied to LUT3, the configuration stored in LUT3 is copied to LUT4 and so forth.

At the rising edge of the second clock cycle t2, the new lookup table configuration F2 is copied from LUT1 to the second lookup table LUT2, such that both LUT1 and LUT2 now employ the same functionality. The remaining lookup tables, however, continue to use the first lookup table configuration F1. That is, configuration F1 from LUT2 is copied to LUT3, configuration F1 from LUT3 is copied to LUT4, configuration F1 from LUT4 is copied to LUT5 and so forth.

At the rising edge of the third clock cycle t3, the new lookup table configuration F2 is copied from the LUT2 to the third lookup table LUT3, such that each of LUT1, LUT2, and LUT3 employ the same functionality. Again, the remaining lookup tables continue to utilize the original lookup table configuration F1. That is, configuration F1 from LUT3 is copied to LUT4, configuration F1 from LUT4 is copied to LUT5, configuration F1 from LUT5 is copied to LUT6 and so forth. After the rising edge of the 8th clock cycle, the new lookup table configuration F2 is copied from LUT7 to the eighth lookup table LUT8, such that all of the lookup tables now employ the same functionality.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single product or packaged into multiple products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous. Accordingly, other implementations are within the scope of the following claims.

What is claimed is:

1. A device comprising:
   an array comprising a plurality of programmable logic blocks, wherein each programmable logic block comprises at least one lookup table, at least one flip-flop, and at least one combinatorial logic circuit element,
   wherein each lookup table of each programmable logic block comprises multiple memory cells configured to store data corresponding to a truth table for a predefined function,
   wherein each memory cell of each programmable logic block is directly coupled to a corresponding memory cell of another programmable logic block in the plurality of programmable logic blocks;
   a common global clock to which each programmable logic block is coupled,
   wherein at least one programmable logic block of the plurality of programmable logic blocks is configured to pass, upon a predetermined clock cycle of the common global clock, data from the memory cells of the lookup table of the at least one programmable logic block directly to the memory cells of the lookup table of at least one other programmable logic block.

2. The device of claim 1, wherein the multiple memory cells of each lookup table comprise CMOS-based memory cells.

3. The device of claim 1, wherein the multiple memory cells of each lookup table comprise static random access memory elements.

4. The device of claim 1, further comprising a memory component separate from the plurality of programmable logic blocks, wherein the memory component is coupled to a subset of the programmable logic blocks, wherein the memory component stores data characterizing at least one lookup table configuration, and wherein the memory component is configured to pass, upon receipt of a control signal, the data characterizing at least one lookup table configuration to the memory cells of the lookup tables of the subset of the programmable logic blocks.

5. The device of claim 4, wherein the memory component is a read-only memory component.

6. The device of claim 4, wherein the memory component stores data characterizing multiple different lookup table configurations, and wherein the memory component is configured to select a particular lookup table configuration from the different lookup table configurations to pass to the memory cells of the lookup tables of the subset of the programmable logic blocks.

7. The device of claim 1, wherein the direct coupling between programmable logic blocks is reconfigurable.

8. A method of updating a lookup table configuration across an array comprising a plurality of programmable logic blocks, wherein each programmable logic block comprises at least one lookup table, at least one flip-flop, and at least one combinatorial logic circuit element,
   wherein each lookup table of each programmable logic block comprises multiple memory cells configured to store data corresponding to a truth table for a predefined function,
   wherein each memory cell of each programmable logic block is directly coupled to a corresponding memory cell of another programmable logic block in the plurality of programmable logic blocks, the method comprising:
   upon receiving, at a first programmable logic block of the plurality of programmable logic blocks, a first predetermined clock pulse from a common global clock that is coupled to each programmable logic block of the plurality of programmable logic blocks, transmitting data characterizing a first truth table for a first predefined function from the memory cells of the first programmable logic block directly to the memory cells of a second programmable logic block of the plurality of programmable logic blocks; and
   upon receiving, at the first programmable logic block, the first predetermined clock pulse, storing data characterizing a second truth table for a second predefined function in the memory cells of the first programmable logic block, wherein the data characterizing the second truth table was received directly from memory cells of a third programmable logic block of the plurality of programmable logic blocks.

\* \* \* \* \*